(12) United States Patent
Kim et al.

(10) Patent No.: US 10,913,240 B2
(45) Date of Patent: *Feb. 9, 2021

(54) INTERIOR MATERIAL HAVING COMPOSITE LAYER STRUCTURE CAPABLE OF LIGHT EMISSION THROUGH VARIOUS LOGO PATTERNS AND METHOD OF MANUFACTURING THE SAME

(71) Applicants: INTOPS CO., LTD., Anyang-si (KR); Keun ha Kim, Anyang-si (KR)

(72) Inventors: Keun ha Kim, Anyang-si (KR); Won jae Choi, Anyang-si (KR); Hong il Lee, Anyang-si (KR)

(73) Assignees: Keun Ha Kim, Anyang-si (KR); INTOPS CO., LTD., Anyang-si (KR)

( * ) Notice: Subject to any disclaimer, the term of this patent is extended or adjusted under 35 U.S.C. 154(b) by 190 days.

This patent is subject to a terminal disclaimer.

(21) Appl. No.: 16/197,512

(22) Filed: Nov. 21, 2018

(65) Prior Publication Data
US 2020/0139670 A1    May 7, 2020

(30) Foreign Application Priority Data

Nov. 1, 2018    (KR) .................. 10-2018-0132950

(51) Int. Cl.
| | | |
|---|---|---|
| B23K 26/26 | (2014.01) | |
| B23K 26/402 | (2014.01) | |
| B29C 43/18 | (2006.01) | |
| B29C 45/00 | (2006.01) | |
| B29C 45/14 | (2006.01) | |
| B32B 21/04 | (2006.01) | |
| B32B 21/08 | (2006.01) | |
| B32B 7/12 | (2006.01) | |
| B32B 27/28 | (2006.01) | |
| B32B 27/32 | (2006.01) | |
| B32B 27/36 | (2006.01) | |
| B32B 3/26 | (2006.01) | |
| B32B 33/00 | (2006.01) | |
| B32B 7/02 | (2019.01) | |

(Continued)

(52) U.S. Cl.
CPC ............... *B32B 7/12* (2013.01); *B23K 26/36* (2013.01); *B23K 26/402* (2013.01); *B29C 45/0053* (2013.01); *B32B 21/042* (2013.01); *C14B 1/56* (2013.01); *G09F 13/06* (2013.01); *H01S 5/0203* (2013.01); *B29C 2045/0079* (2013.01)

(58) Field of Classification Search
None
See application file for complete search history.

(56) References Cited

U.S. PATENT DOCUMENTS 9,358,944 B1    6/2016    Aselage et al.
2002/0031620 A1    3/2002    Yuzawa et al.

FOREIGN PATENT DOCUMENTS

DE    10118178 A1    10/2002
KR    10-2018-0071801 A    6/2018

*Primary Examiner* — Stephanie P Duclair
(74) *Attorney, Agent, or Firm* — KORUS Patent, LLC; Seong Il Jeong

(57) ABSTRACT

Disclosed herein is a method of manufacturing an interior material, which can implement various and distinct light emission effects by disposing a light-blocking layer configured to block light emitted from a light source on a wood layer or transparent film and then allowing the component of the transparent film to fill lighting grooves formed by laser-etching. Since a tape configured to support an island is employed, stable manufacturing is possible throughout an overall process.

3 Claims, 5 Drawing Sheets

(51) Int. Cl.
*B32B 37/12* (2006.01)
*B32B 38/06* (2006.01)
*B32B 38/10* (2006.01)
*B32B 9/00* (2006.01)
*B32B 9/04* (2006.01)
*B44C 5/04* (2006.01)
*B44F 1/06* (2006.01)
*C14B 1/56* (2006.01)
*E04B 2/00* (2006.01)
*G02B 1/04* (2006.01)
*G09F 13/06* (2006.01)
*H01S 5/02* (2006.01)
*B23K 26/36* (2014.01)

Bond a material layer and a blocking layer to each other (S10)

Attach a support tape to the material layer (S12)

Form lighting grooves (S14)

Attach a binder to a transparent film (s20)
FIG. 2B
Combine the material layer and the blocking layer, through which the lighting grooves have been formed, with a second module (S30)
Bond a fresh support tape to the material layer (S32)
Perform insert injection (S34)
FIG. 2C

ND METHOD

INTERIOR MATERIAL HAVING COMPOSITE LAYER STRUCTURE CAPABLE OF LIGHT EMISSION THROUGH VARIOUS LOGO PATTERNS AND METHOD OF MANUFACTURING THE SAME

BACKGROUND

1. Technical Field

The present invention relates to an interior material having a composite layer structure capable of light emission through various logo patterns, and a method of manufacturing the same. More specifically, the present invention relates to an interior material having a composite layer structure, which includes an improved blocking structure required to appropriately emit light through logo patterns and a logo lighting portion, and a method of manufacturing the same.

2. Description of the Related Art

The term "interior material" refers to a material used to finish the exterior of a product. The interior material functions to improve the appearance of a product, such as texture and touch feeling, and to protect internal components by blocking noise, flame, oxygen, etc. The interior material is preferably manufactured so that aesthetic elements can be expressed externally.

Korean Patent No. 10-0913811 discloses a molded article including a real wood film, which is used as an interior material. The molded article is manufactured by heat-pressing an adhesive film on the upper and lower sides of a real wool sheet. The molded article manufactured as described above is applied to automotive interior/exterior materials or various electronic product panels. Since the interior material includes the real wood material, it mimics the texture of natural wood, and can thus exhibits an aesthetic appearance.

In recent years, as shown in FIG. 1, an interior material having a logo, such as "ABCDE," formed on a molded article made of real wood material has been proposed. This interior material is configured to emit light through the logo. A portion isolated from other portions by the logo is an island.

As a method of emitting light through the logo, Korean Patent No. 10-1883080, filed by the present applicant, discloses a technology of emitting light through the logo portion by forming a light-blocking layer under a real wood layer which is a main surface material, forming a touch sensor electrode under the light-blocking layer, and disposing a light source under the touch sensor electrode. However, in the above-mentioned patent, lighting grooves through which light passes are hollow, and thus a foreign material, such as dust, may be deposited in the hollow portion, thus reducing transmittance. In addition, the disclosed technology has disadvantages in that it is difficult to apply to a composite film structure composed of two or more film layers, and thus the molded article has weak durability, and in that it is difficult to form various logo patterns. Furthermore, since the molded article has no support configured to support the island portion, a problem arises in that the precise injection molding of the island portion is difficult during the manufacture of the molded article.

SUMMARY

Accordingly, an object of the present invention is to provide a method of manufacturing an interior material having a multilayer structure, which can form a logo lighting portion having various patterns and can easily manufacture an interior material having excellent durability.

The method of manufacturing an interior material according to the present invention can implement various and clear light emission effects by disposing a blocking layer configured to block light emitted from a light source at a location adjacent to a wood layer or inner transparent film as a material layer and then allowing the component of the transparent film to fill lighting grooves formed by laser etching.

More specifically, the present invention provides a method of manufacturing an interior material, comprising the steps of: (1-1) bonding a blocking layer for blocking the transmission of light below a material layer with a hot-melt layer interposed therebetween; (1-2) attaching a support tape for supporting an island to the upper surface of the material layer; (1-3) forming lighting grooves, through which light passes, by laser-etching a predetermined portion from the blocking layer to the material layer; (2-1) attaching a binder to a transparent film; (3-1) combining a module resulting from step (1-3) with a module resulting from step (2-1); (3-2) replacing the support tape on the material layer with a fresh support tape; and (3-3) obtaining an interior material by bonding a product from step (3-2) to a base material or an article to be processed, which has a base layer, to obtain a molding material, and then subjecting the molding material to an injection molding process, wherein the injection molding process is performed at high temperature such that the transparent film is melted and stretched to fill the lighting grooves.

Furthermore, the present invention provides an interior material manufactured by the above-described method.

BRIEF DESCRIPTION OF THE DRAWINGS

The above and other objects, features and advantages of the present invention will be more clearly understood from the following detailed description taken in conjunction with the accompanying drawings, in which:

FIGS. 2a to 2c are flowcharts showing a method of manufacturing an interior material including a logo lighting portion according to a first embodiment of the present invention.

DETAILED DESCRIPTION

Some embodiments of the present invention will be described in detail below with reference to the exemplary drawings.

It should be noted that the same reference symbols are assigned to the same components as much as possible even when they are illustrated in different drawings. In the following description of the embodiments, when it is determined that a detailed description of a related well-known function or configuration may make the gist of the present invention obscure, it will be omitted.

The following embodiments of the present invention are partially characterized by specifying a particular material for filling lighting grooves, i.e., guides through which light emitted from a light source passes.

Figure 1:
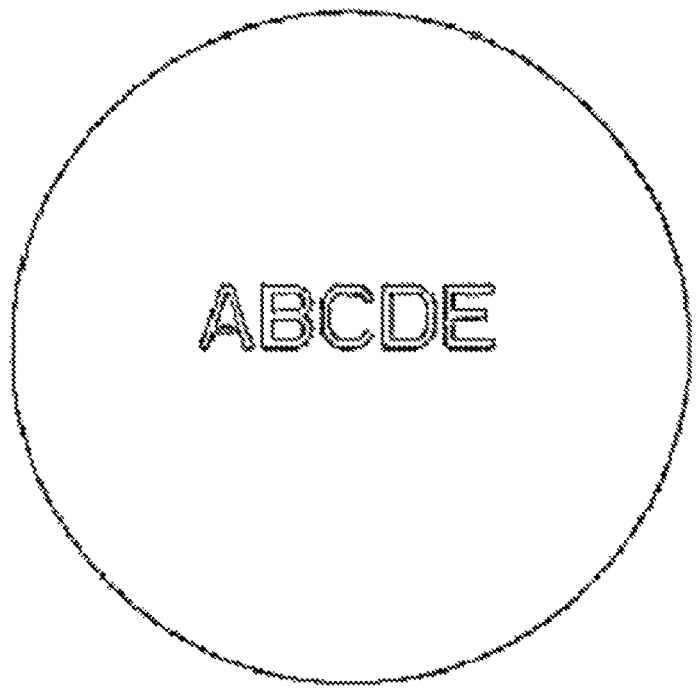
FIG. 1 is a view showing a molded article including a real wood material.
Figure 2A:
Figure 2A:

FIGS. 2a to 2c are flowcharts showing a method of manufacturing an interior material including a logo lighting portion according to a first embodiment of the present invention, and FIGS. 3a to 3g are sectional views of members manufactured by the respective steps shown in FIG. 2.

Referring to these drawings together, first, a wood or material layer 10 is provided as a main material that forms the outer portion of the interior material. In this case, the "wood" is merely one example, and fabric, stone, artificial leather, carbon fiber reinforced plastic (CFRP), or glass fiber reinforced plastic (GFRP) may be used instead of the wood. A blocking layer 14 is placed below the material layer 10 with a hot-melt layer 12 interposed therebetween. The hot-melt layer 12 may include a nonwoven material, such as pulp, fiber or mesh, and a thermoplastic polymer composition having appropriate thermal reaction characteristics. Another hot-melt layer 16 is placed on the lower surface of the blocking layer 14. The blocking layer 14 is intended to block light emitted from a light source (not shown) and prevent a portion, other than logos, from being lit, and is fabricated by performing printing or painting on a transparent film. The material layer 10 and the blocking layer 14 are bonded to each other by, for example, a roll laminating process at step S10.

Thereafter, a support tape 18 is attached to the other surface (i.e., the upper surface) of the material layer 10 in order to support an island at step S12. The support tape 18 functions to support and fix the island during a process of forming lighting grooves to be described below. The support tape 18 is made of, for example, a polyethylene terephthalate (PET)-based silicone material.

Thereafter, lighting grooves L1 and L2 that pass through the hot-melt layer 16 and the material layer 10 are formed by laser etching at step S14. The lighting grooves L1 and L2 are shown by way of example, and may be formed in the shape of one or more lines. Via the above process, a first module 50 constituting part of the interior material of the present invention is obtained (see FIG. 3c). It will be understood by those skilled in the art that the first module 50 includes at least the material layer 10, the blocking layer 14, and the lighting grooves L1 and L2.

Figure 3A:
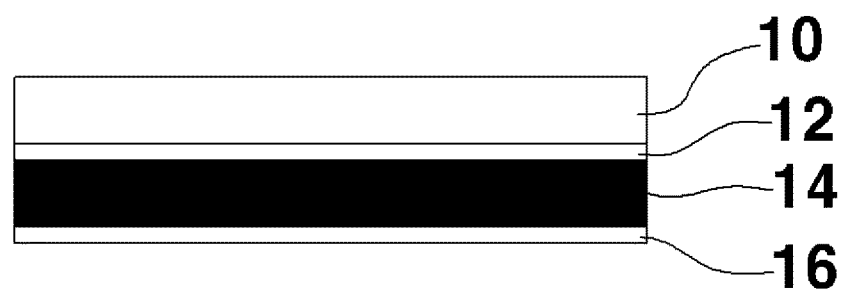
FIGS. 3a to 3g are sectional views of members manufactured by the steps shown in FIG. 2.
Figure 3B:
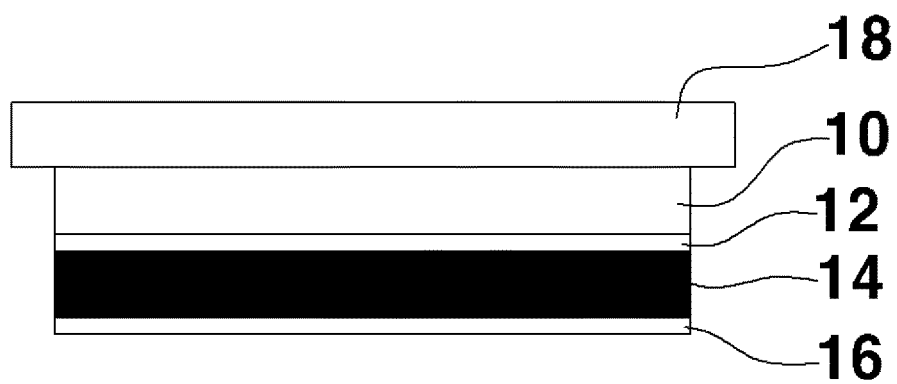
Figure 3C:
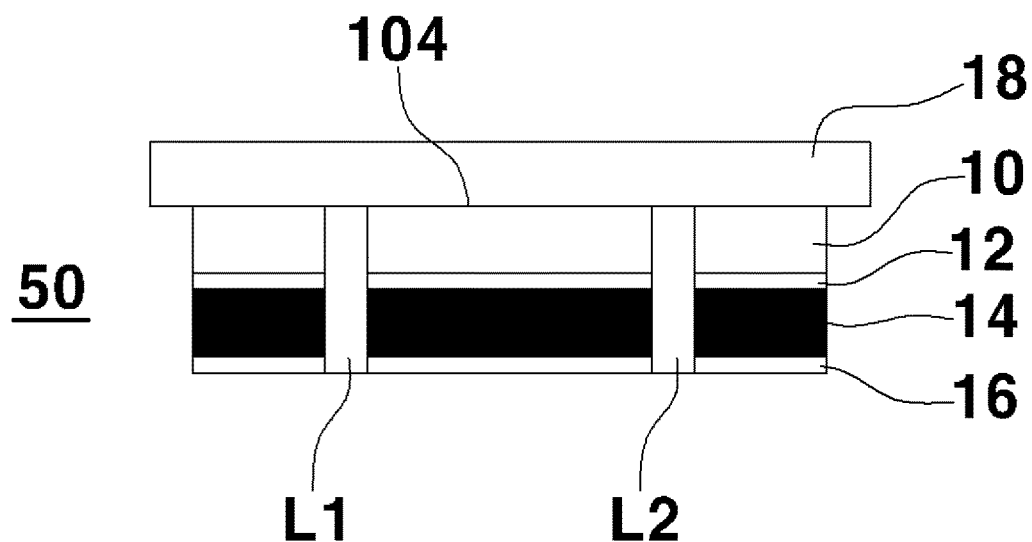
Figure 3D:
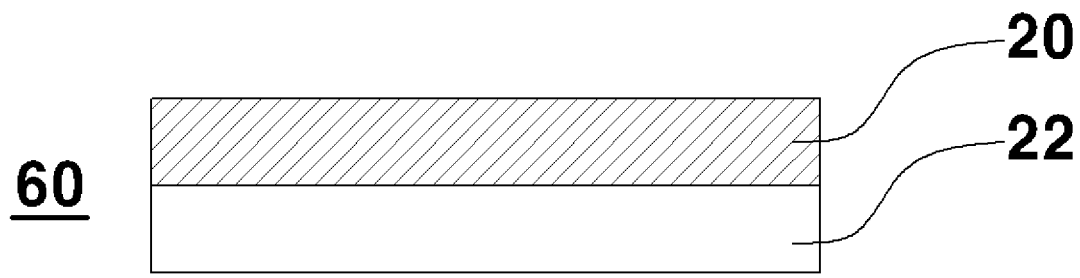

Meanwhile, separately from the above-described process, as shown in FIG. 3d, a second module 60 is obtained by attaching a binder 22 to a transparent film 20 at step S20. The transparent film 20 may be, for example, an optical transparent film made of a thermoplastic polymer selected from the group consisting of polycarbonate (PC), polyimide (PI), polyethersulfone (PES), polyarylate (PAR), poly(ethylene naphthalate) (PEN), polyethylene terephthalate (PET), a cycloolefin copolymer, and a mixture of two or more thereof. The binder 22 is preferably a copolymer, such as acrylic resin, but may be also made of a metal or ceramic material to be bonded to a base material layer.

Figure 3E:
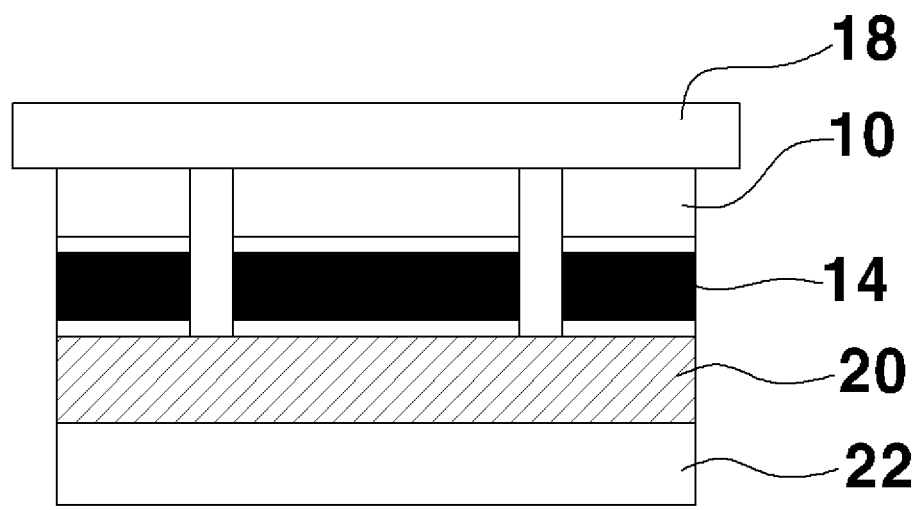
Figure 3F:
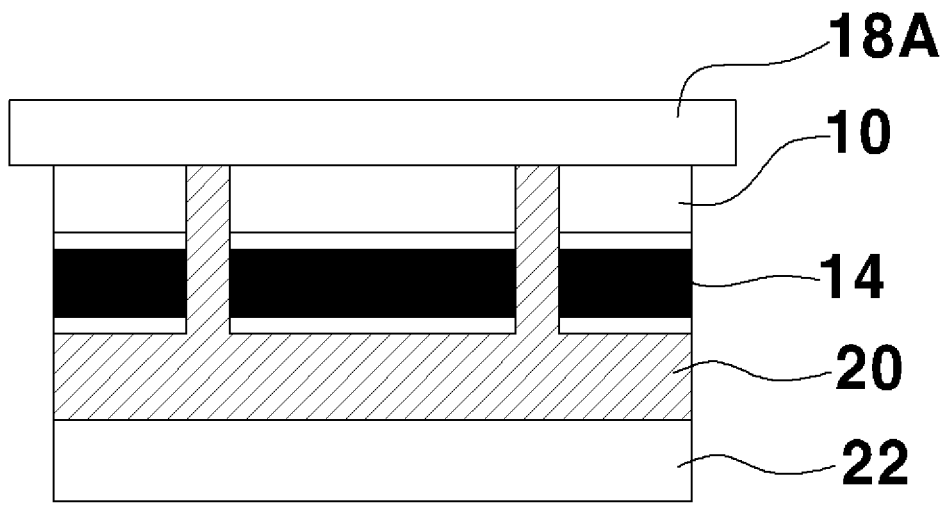

Thereafter, the first module 50 and the second module 60 are bonded to each other by a heat pressing process with the hot-melt layer 16 interposed therebetween at step S30 (see FIG. 3e).

The support tape 18 located on the material layer 10 may have small powder precipitates produced during the etching of the lighting grooves L1 and L2. To remove this precipitates, the support tape 18 is peeled off, and a fresh support tape 18A is attached at step S32. The support tape 18A functions to protect the upper surface of the material layer including an island during a molding process to be described below.

Finally, the resulting material is bonded to a base material or an article to be processed, which includes a base material layer 24, and is then subjected to an injection molding process, thereby obtaining an interior material at step S34.

Figure 3G:
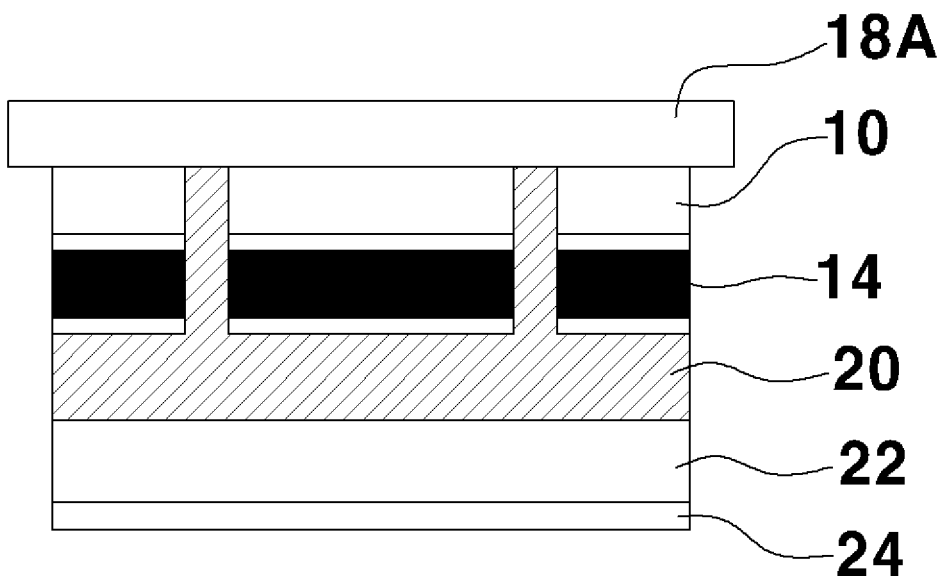

Since a light source (not shown) is disposed under the base material layer 24, the base material layer 24 is made of a transparent or semitransparent material, such as polycarbonate (PC) or acrylonitrile butadiene styrene (ABS) resin in order to enable sufficient light transmittance. As shown in FIG. 3g, the injection molding process is performed at high temperature such that the transparent film 20 is melted and stretched to fill the lighting grooves L1 and L2.

Therefore, according to the above-described embodiment of the present invention, an interior material having a composite layer can be fabricated by coupling the first module 50 and the second module 60 to each other. Clearer logo lighting can be expected due to the resin component of the transparent film filling the lighting grooves L1 and L2, and foreign materials can be prevented from entering the lighting grooves L1 and L2.

As described above, according to the present invention, clearer logo lighting can be made possible via the transparent film filling the lighting grooves in the interior material having the composite layer, and foreign materials can be prevented from entering the lighting grooves, and a logo lighting portion having various patterns can be formed.

The method of manufacturing the interior material according to the present invention is simple, cost-effective, and advantageous in terms of cost saving.

Although the preferred embodiments of the present invention have been described for illustrative purposes, these are merely examples, and do not limit the scope of the present invention. Various modifications may be made without departing from the scope of the invention, and fall within the scope of the present invention. The scope of the present invention is defined based on the attached claims.

What is claimed is:

1. A method of manufacturing an interior material, comprising the steps of:
   (1-1) bonding a blocking layer for blocking transmission of light below a material layer with a hot-melt layer interposed therebetween;
   (1-2) attaching a support tape for supporting an island to the upper surface of the material layer;
   (1-3) forming lighting grooves, through which light passes, by laser-etching a predetermined portion from the blocking layer to the material layer;
   (2-1) attaching a binder to a transparent film;
   (3-1) combining a module resulting from step (1-3) with a module resulting from step (2-1);
   (3-2) replacing the support tape on the material layer with a fresh support tape to form a product; and
   (3-3) obtaining an interior material by bonding the product from step (3-2) to a base material or an article to be processed, which has a base layer, to obtain a molding material, and then subjecting the molding material to an injection molding process, wherein the injection molding process is performed at a predetermined temperature such that the transparent film is melted and stretched to fill the lighting grooves.

2. The method of claim 1, wherein the transparent film is made of a thermoplastic polymer selected from the group consisting of polycarbonate (PC), polyimide (PI), polyethersulfone (PES), polyarylate (PAR), poly(ethylene naphthalate) (PEN), polyethylene terephthalate (PET), a cycloolefin copolymer, and a mixture of two or more thereof.

3. The method of claim 1, wherein the material layer is made of one of wood, fabric, stone, artificial leather, carbon fiber reinforced plastic (CFRP), and glass fiber reinforced plastic (GFRP).

* * * * *